(12) United States Patent
Nagano (10) Patent No.: US 7,304,293 B2
(45) Date of Patent: Dec. 4, 2007

(54) LASER MODULE

(75) Inventor: Kazuhiko Nagano, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/483,523

(22) Filed: Jul. 11, 2006

(65) Prior Publication Data

US 2007/0007440 A1 Jan. 11, 2007

(30) Foreign Application Priority Data

Jul. 11, 2005 (JP) ............................. 2005-202291

(51) Int. Cl.
*H01J 5/16* (2006.01)
*G02B 6/36* (2006.01)

(52) U.S. Cl. ................... 250/227.11; 250/216; 385/88; 385/93; 372/34

(58) Field of Classification Search ........... 250/227.11, 250/216, 552, 239; 385/88–94; 372/34–36
See application file for complete search history.

(56) References Cited

U.S. PATENT DOCUMENTS 4,955,684 A * 9/1990 Shiga ........................ 385/39

5,740,191 A * 4/1998 Kasper et al. ............... 372/34

FOREIGN PATENT DOCUMENTS

JP 7-168064 A 7/1995
JP 2004-288879 A 10/2004

\* cited by examiner

*Primary Examiner*—Kevin Pyo
(74) *Attorney, Agent, or Firm*—Sughrue Mion Pllc.

(57) ABSTRACT

A laser unit containing a laser package, in which a laser element has been hermetically sealed, is connected with a converging optical system unit containing a converging optical system. The laser unit is provided with a laser package holder, which comprises a holder main body for supporting the laser package and a connecting member. The converging optical system unit is provided with a converging optical system holder, which comprises a holder main body for supporting the converging optical system and a connecting member having been welded to the connecting member of the laser package holder. A thermal conductivity of the holder main body of the laser package holder is set to be larger than the thermal conductivities of the connecting member of the laser package holder and the connecting member of the converging optical system holder.

10 Claims, 4 Drawing Sheets

LASER MODULE

BACKGROUND OF THE INVENTION

1. Field of the Invention

This invention relates to a laser module. This invention particularly relates to a laser module, which comprises a laser element, a converging optical system for converging a laser beam having been radiated out from the laser element, and an optical fiber for receiving the laser beam having been converged by the converging optical system, the laser element and the converging optical system having been combined into a unit.

2. Description of the Related Art

So-called pig tail types of laser modules have heretofore been proposed. The proposed laser modules comprise a laser package, which is provided with a laser beam transmissive window for radiation of a laser beam and in which a laser element has been hermetically sealed, a converging optical system for converging the laser beam having been radiated out from the laser package, and an optical fiber for receiving the laser beam having been converged by the converging optical system, at least the laser package and the converging optical system having been combined into a unit.

By way of example, a laser module, wherein the laser package and the converging optical system have been accommodated in an identical holder, and wherein an end section of the optical fiber on the laser beam incidence side is also accommodated within the holder, has been disclosed in, for example, Japanese Unexamined Patent Publication No. 2004-288879. Also, a laser module, wherein the laser package and the converging optical system have been accommodated respectively in different holders, wherein the holder accommodating the laser package and the holder accommodating the converging optical system have been welded to each other, and wherein a receptacle for receiving the end section of the optical fiber on the laser beam incidence side has been fitted to the holder accommodating the converging optical system, has been disclosed in, for example, Japanese Unexamined Patent Publication No. 7(1995)-168064.

From the view point of the easiness of the welding of members to each other, general-purpose properties, and the like, ordinarily, a stainless steel (SUS304) has heretofore been utilized as the material of the aforesaid holder. The stainless steel (SUS) has a comparatively low thermal conductivity of approximately 16 W/mK. By virtue of the low heat diffusing characteristics, the stainless steel is appropriate for the welding operation.

As the laser element, a laser element having a comparatively low output power, such as an infrared semiconductor laser element, which produces a laser beam having a wavelength of 980 nm and has an output power of 90 mW, has heretofore been utilized. An electric power-to-laser beam conversion efficiency of the infrared semiconductor laser element is estimated to fall within the range of 40% to 60%, and the quantity of heat released from the laser element at the time of the output power of 90 mW is estimated to fall within the range of 60 mW to 135 mW.

Recently, it is studied to utilize an ultraviolet semiconductor laser element (i.e., a broad area semiconductor laser element), such as a GaN type of an ultraviolet semiconductor laser element, which has a high output power, e.g. an output power falling within the range of 200 mW to 500 mW, as the aforesaid laser element. The electric power-to-laser beam conversion efficiency of the ultraviolet semiconductor laser element, such as the GaN type of the ultraviolet semiconductor laser element, is estimated to fall within the range of 20% to 25%, and the quantity of heat released from the laser element at the time of the output power of 500 mW is estimated to fall within the range of 1.5 W to 2 W. The quantity of heat released from the ultraviolet semiconductor laser element is approximately five to six times as large as the quantity of heat released from the infrared type of the semiconductor laser element. Therefore, in cases where the holder made from the stainless steel (SUS304) having the low thermal conductivity is utilized, the heat released from the ultraviolet semiconductor laser element is not capable of being dissipated sufficiently.

Also, regardless of the types of the laser elements, in the cases of a beam combining type of module utilizing a laser package, in which a plurality of laser elements have been hermetically sealed, as the number of the laser elements becomes large, the total heat release quantity within the laser package becomes large. Therefore, in cases where the holder made from the stainless steel (SUS) having the low thermal conductivity is utilized, the heat released from the laser elements is not capable of being dissipated sufficiently.

If the heat released from the laser element is not capable of being dissipated sufficiently, the problems will occur in that the life time of the module becomes short due to thermal deterioration of the laser element, and the like. In, for example, Japanese Unexamined Patent Publication No. 2004-288879, a heat dissipating structure, in which the heat dissipation is performed with a temperature control unit, such as a Peltier element, fitted to a laser package, is described as the related art. Also, in, for example, Japanese Unexamined Patent Publication No. 2004-288879, there is disclosed a heat dissipating structure, wherein a stem (2), which is made from a material having good thermal conduction characteristics, such as CuW, and which has an L-shaped cross-section, is fitted to a laser package, and wherein the heat dissipating characteristics are enhanced without a temperature control unit being utilized.

However, with the conventional techniques, in which the temperature control unit or the stem (2) having the L-shaped cross-section is fitted to the laser package in order for the heat dissipating characteristics to be enhanced, the problems occur in that the number of parts is not capable of being kept small, the cost is not capable of being kept low, and the size of the module is not capable of being kept small.

Also, in, for example, Japanese Unexamined Patent Publication No. 7(1995)-168064 disclosing the laser module, wherein the laser package and the converging optical system have been accommodated respectively in different holders, and wherein the holder accommodating the laser package and the holder accommodating the converging optical system have been welded to each other, nothing is disclosed with respect to a heat dissipating structure to be utilized in cases where a high output power laser element is utilized.

SUMMARY OF THE INVENTION

The primary object of the present invention is to provide a small-sized pig tail type of laser module, wherein a particular heat dissipating member need not be provided, wherein heat dissipating characteristics with respect to heat released from a laser element are enhanced, and wherein the laser module is capable of coping with a system in which a heat release quantity within a laser package is large (e.g., a system in which a high output power laser element, such as a GaN type of laser element, is utilized, or a system in which a plurality of laser elements are utilized).

The present invention provides a first laser module, comprising:

i) a laser unit containing a laser package, which is provided with a laser beam transmissive window for radiation of a laser beam and in which at least one laser element has been hermetically sealed, ii) a converging optical system unit, which contains a converging optical system for converging the laser beam having been radiated out from the laser package, and iii) an optical fiber for receiving the laser beam having been converged by the converging optical system, the laser unit and the converging optical system unit having been connected to each other, wherein the laser unit is provided with a laser package holder, which comprises (a) a holder main body for supporting and accommodating the laser package, and (b) a connecting member for connection to the converging optical system unit, the connecting member having been secured to the holder main body of the laser package holder, the converging optical system unit is provided with a converging optical system holder, which comprises (a) a holder main body for supporting and accommodating the converging optical system, and (b) a connecting member for connection to the laser unit, the connecting member having been secured to the holder main body of the converging optical system holder, the connecting member of the laser package holder and the connecting member of the converging optical system holder have been welded to each other, and a thermal conductivity of the holder main body of the laser package holder is set at a value, which is larger than the thermal conductivity of the connecting member of the laser package holder and the thermal conductivity of the connecting member of the converging optical system holder.

The first laser module in accordance with the present invention should preferably be modified such that the thermal conductivity of the holder main body of the laser package holder is equal to at least 150 W/mK, and the thermal conductivity of the connecting member of the laser package holder and the thermal conductivity of the connecting member of the converging optical system holder are equal to at most 30 W/mK.

The term "thermal conductivity" as used herein means the thermal conductivity calculated from the results of measurement, in which heat is caused to flow through a sample having a predetermined cross-sectional shape, and in which a temperature difference with respect to a predetermined length of the sample is measured by use of an element, such as a thermocouple.

The present invention also provides a second laser module, comprising:

i) a laser unit containing a laser package, which is provided with a laser beam transmissive window for radiation of a laser beam and in which at least one laser element has been hermetically sealed, ii) a converging optical system unit, which contains a converging optical system for converging the laser beam having been radiated out from the laser package, and iii) an optical fiber for receiving the laser beam having been converged by the converging optical system, the laser unit and the converging optical system unit having been connected to each other, wherein the laser unit is provided with a laser package holder, which comprises (a) a holder main body for supporting and accommodating the laser package, and (b) a connecting member for connection to the converging optical system unit, the connecting member having been secured to the holder main body of the laser package holder, the converging optical system unit is provided with a converging optical system holder for supporting and accommodating the converging optical system, the connecting member of the laser package holder and the converging optical system holder have been welded to each other, and a thermal conductivity of the holder main body of the laser package holder is set at a value, which is larger than the thermal conductivity of the connecting member of the laser package holder and the thermal conductivity of the converging optical system holder.

The second laser module in accordance with the present invention should preferably be modified such that the thermal conductivity of the holder main body of the laser package holder is equal to at least 150 W/mK, and the thermal conductivity of the connecting member of the laser package holder and the thermal conductivity of the converging optical system holder are equal to at most 30 W/mK.

Also, each of the first and second laser modules in accordance with the present invention should preferably be modified such that the converging optical system holder is provided with a receptacle for receiving an end section of the optical fiber, which end section is located on a laser beam incidence side, and a laser beam transmissive protecting member, which comes into contact with a laser beam incidence surface of the optical fiber having been fitted into the receptacle and thereby protects the laser beam incidence surface of the optical fiber.

In such cases, each of the first and second laser modules in accordance with the present invention should more preferably be modified such that a power density of the laser beam impinging upon a laser beam incidence surface of the laser beam transmissive protecting member is set to be at most 10 W/mm$^2$.

The term "power density" as used herein means the power density as measured by use of Thermal Type Power Meter 13PEM001 (supplied by Melles Griot Co.).

Each of the first and second laser modules in accordance with the present invention is efficient particularly in cases where the laser element is of the type producing the laser beam having a wavelength falling within the range of 350 nm to 500 nm.

With the first laser module in accordance with the present invention, the laser unit is provided with the laser package holder, which comprises (a) the holder main body for supporting and accommodating the laser package, and (b) the connecting member for connection to the converging optical system unit, the connecting member having been secured to the holder main body of the laser package holder. Also, the converging optical system unit is provided with the converging optical system holder, which comprises (a) the holder main body for supporting and accommodating the converging optical system, and (b) the connecting member for connection to the laser unit, the connecting member having been secured to the holder main body of the converging optical system holder. The connecting member of the laser package holder and the connecting member of the converging optical system holder have been welded to each other.

Further, with the first laser module in accordance with the present invention, the thermal conductivity of the holder main body of the laser package holder is set at a value, which is larger than the thermal conductivity of the connecting member of the laser package holder and the thermal conductivity of the connecting member of the converging optical system holder. The first laser module in accordance with the present invention should preferably be modified such that the thermal conductivity of the holder main body of the laser package holder is equal to at least 150 W/mK, and the thermal conductivity of the connecting member of the laser package holder and the thermal conductivity of the connecting member of the converging optical system holder are equal to at most 30 W/mK.

With the first laser module in accordance with the present invention, the thermal conductivity of the holder main body of the laser package holder is set at a comparatively large value. Therefore, a particular heat dissipating member need not be provided, and the heat dissipating characteristics with respect to the heat released from the laser element are capable of being enhanced. Also, the thermal conductivity of the connecting member of the laser package holder and the thermal conductivity of the connecting member of the converging optical system holder are set at comparatively small values. Therefore, conduction of welding heat to the region within the laser package holder is capable of being suppressed. With the first laser module in accordance with the present invention, it is possible to furnish a small-sized pig tail type of laser module having a simple module structure and capable of coping with a system in which a heat release quantity within a laser package is large (e.g., a system in which a high output power laser element, such as a GaN type of laser element, is utilized, or a system in which a plurality of laser elements are utilized).

With the second laser module in accordance with the present invention, the connecting member of the laser package holder and the converging optical system holder have been welded to each other, and the thermal conductivity of the holder main body of the laser package holder is set at a value, which is larger than the thermal conductivity of the connecting member of the laser package holder and the thermal conductivity of the converging optical system holder. The second laser module in accordance with the present invention has the structure basically identical with the structure of the aforesaid first laser module in accordance with the present invention. Therefore, with the second laser module in accordance with the present invention, the same effects as those obtained with the aforesaid first laser module in accordance with the present invention are capable of being obtained.

DESCRIPTION OF THE PREFERRED EMBODIMENTS

The present invention will hereinbelow be described in further detail with reference to the accompanying drawings.

Figure 1:
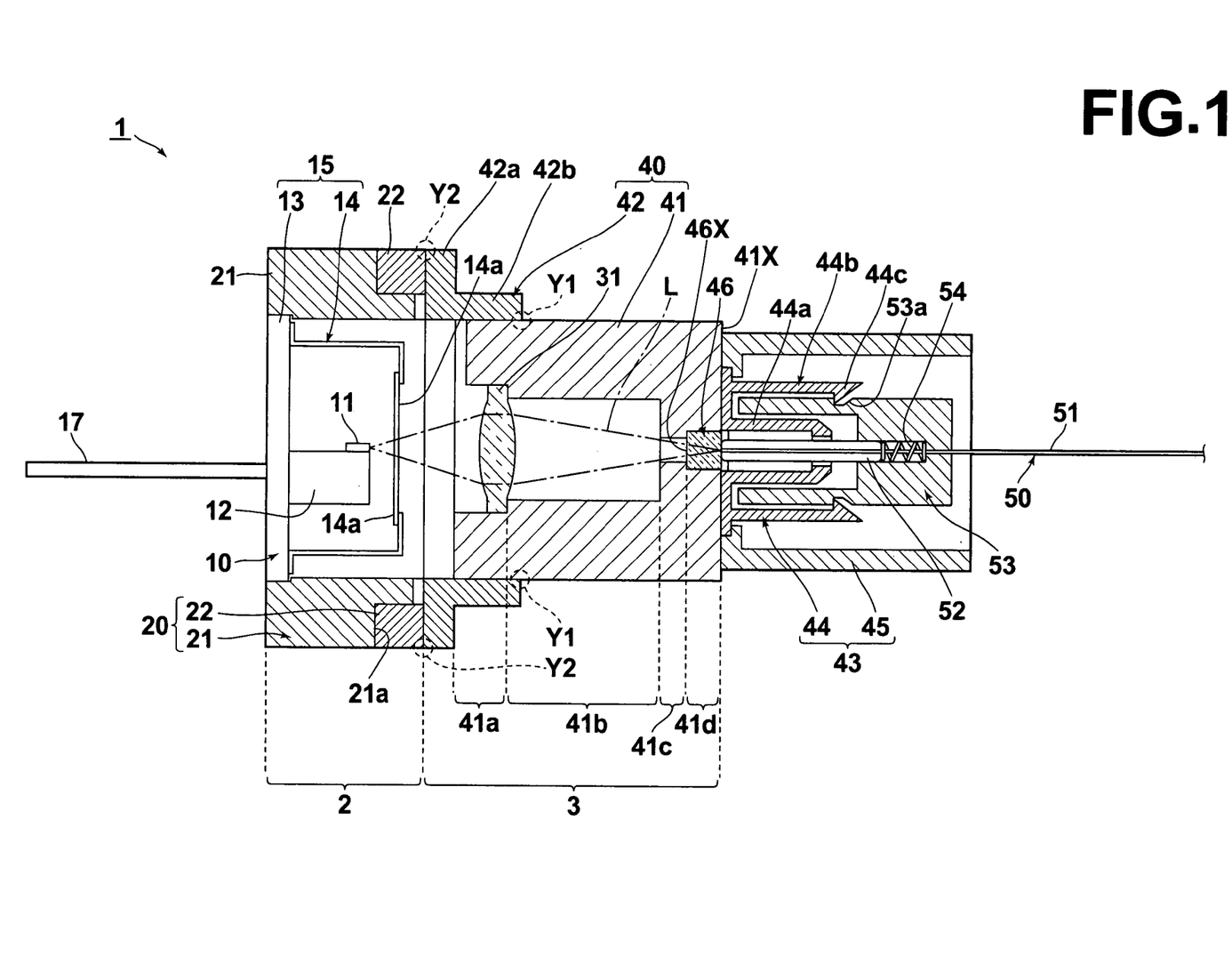
FIG. 1 is a sectional view showing an embodiment of the laser module in accordance with the present invention in a state, in which a receptacle of the laser module and an optical fiber have been connected to each other.
Figure 2:
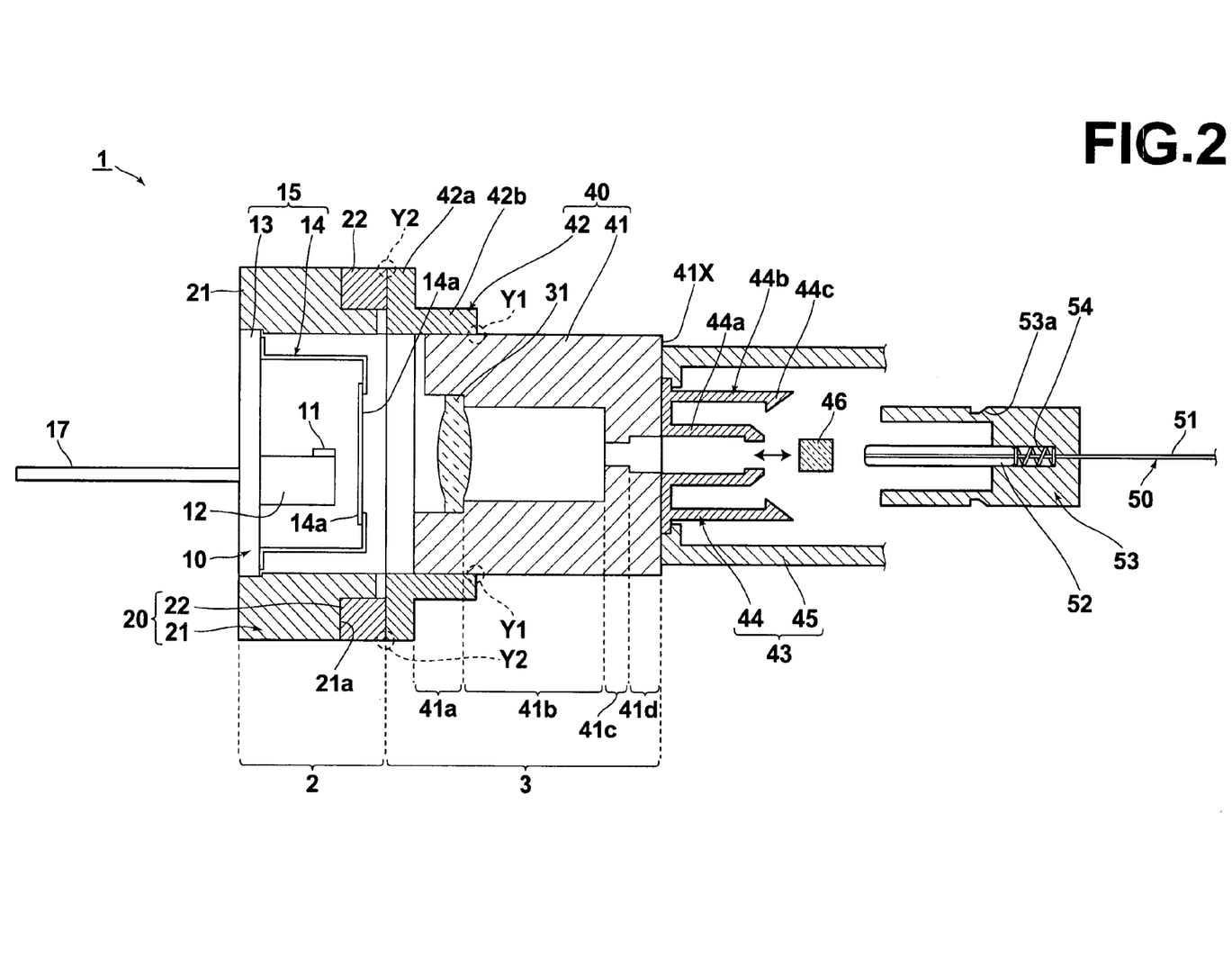
FIG. 2 is a sectional view showing the embodiment of the laser module in accordance with the present invention in a state, in which the receptacle of the laser module and the optical fiber are being connected to each other.

FIG. 1 is a sectional view showing an embodiment of the laser module in accordance with the present invention in a state, in which a receptacle of the laser module and an optical fiber have been connected to each other. FIG. 2 is a sectional view showing the embodiment of the laser module in accordance with the present invention in a state, in which the receptacle of the laser module and the optical fiber are being connected to each other. (Each of FIG. 1 and FIG. 2 is the sectional view passing through an optical axis.)

A laser module 1, which is an embodiment of the laser module in accordance with the present invention, is constituted as the so-called pig tail type of laser module. The laser module 1 comprises a laser unit 2 containing a laser package 10, in which a laser element 11 acting as a laser beam source has been hermetically sealed. The laser module 1 also comprises a converging optical system unit 3, which contains a converging lens (acting as a converging optical system) 31 for converging a laser beam L having been radiated out from the laser package laser package 10. The laser module 1 further comprises an optical fiber 51 for receiving the laser beam L having been converged by the converging lens 31. The laser unit 2 and the converging optical system unit 3 have been connected to each other into a unit.

The laser package 10 comprises a can package 15 and the one laser element 11, which has been hermetically sealed in the can package 15. The can package 15 is constituted of a circular disk-shaped package base 13 and a cap 14 having an approximately U-shaped cross-section. The cap 14 is provided with a laser beam transmissive window 14a for radiation of the laser beam L. The package base 13 and the cap 14 have been hermetically welded to each other by resistance welding. An inert gas should preferably be encapsulated in the can package 15.

Such that heat diffusion at the time of the welding of the package base 13 and the cap 14 to each other may be suppressed, the package base 13 is made from a material, which has a low thermal conductivity and has a low coefficient of thermal expansion close to the coefficient of thermal expansion of a lead wire sealing material. Specifically, the package base 13 may be made from an Fe—Ni—Co alloy (thermal conductivity: 10 W/mk), an Fe—Ni alloy (thermal conductivity: 10 W/mK), a CuW alloy (thermal conductivity: 200 W/mK), or the like. Also, the cap 14 may be made from an Fe—Ni—Co alloy (thermal conductivity: 14 W/mk), an Fe—Ni alloy (Fe content: 42%, thermal conductivity: 14 W/mK), or the like. The laser beam transmissive window 14a may be made from glass, or the like.

As the package base 13, it is also possible to employ a package base, which is constituted of a Cu base plate and a low thermal conductive member, such as a Fe—Ni—Co alloy, bonded to an area of the Cu base plate to be welded to the cap 14. As the package base 13, it is further possible to employ a Fe/Cu/Fe laminate structure body, or the like. (In cases where the Fe/Cu/Fe laminate structure body is employed as the package base 13, the surface of the area of the Fe/Cu/Fe laminate structure body, which area is to be welded to the cap 14, is constituted of Fe, which is the low thermal conductive material.) With the package base 13 made from one of the materials described above, the lead wire sealing section is constituted of Cu, and a thermal stress is capable of being suppressed even further. Therefore, from the view point of the hermetic sealing characteristics at the lead wire sealing section, the package base 13 should preferably be made from one of the materials described above.

No limitation is imposed upon the type of the laser element 11. By way of example, the laser element 11 may be constituted of a GaN type of semiconductor laser element (wavelength distribution range of the produced laser beam: 370 nm to 450 nm), an AlGaInP type of semiconductor laser element (wavelength distribution range of the produced laser beam: 580 nm to 690 nm), an InGaP type of semiconductor laser element (wavelength distribution range of the produced laser beam: 650 nm to 1,000 nm), an AlGaAs type of semiconductor laser element (wavelength distribution range of the produced laser beam: 700 nm to 1,000 nm), a GaAsP type of semiconductor laser element (wavelength distribution range of the produced laser beam: 700 nm to 1,000 nm), an InGaAs type of semiconductor laser element (wavelength distribution range of the produced laser beam: 1,000 nm to 3,500 nm), an InAsP type of semiconductor laser element (wavelength distribution range of the produced laser beam: 1,000 nm to 3,500 nm), or the like.

This embodiment of the laser module 1 is capable of coping with the use of an infrared semiconductor layer element, which has a comparatively low output power and has heretofore been used widely, and the use of an ultraviolet semiconductor laser element having a high output power (such as a GaN type, wavelength distribution range of the produced laser beam: 350 nm to 500 nm, output power: e.g., 200 mW to 500 mW).

A heat dissipating block 12 is protruded from the package base 13 of the can package 15. The laser element 11 is mounted on the heat dissipating block 12 via a brazing material (such as AuSn or In) by use of a known technique. The heat dissipating block 12 should preferably be made from Cu (thermal conductivity: 395 W/mK), or the like. The laser element 11 is located such that a laser beam radiating surface of the laser element 11 may stands facing the laser beam transmissive window 14a of the can package 15. A wiring system 17 containing the lead wire for supplying an actuating electric current to the laser element 11, or the like, is drawn out from the package base 13 of the can package 15 to the exterior.

In cases where the Fe/Cu/Fe laminate structure body is employed as the package base 13, the heat dissipating block 12 and the package base 13 may be integrally molded with press processing, or the like, by use of the Fe/Cu/Fe laminate structure body. In such cases, since the surface of the area of the Fe/Cu/Fe laminate structure body, which area is to be welded to the cap 14, is constituted of an Fe layer, the welding of the package base 13 and the cap 14 to each other is capable of being performed appropriately. Also, since the inside region of the heat dissipating block 12 and the inside region of the package base 13 are constituted of Cu, good heat dissipating characteristics are capable of being obtained. Further, since the heat dissipating block 12 and the package base 13 are formed with the integral molding technique, the cost is capable of being kept low.

Besides the laser package 10, the laser unit 2 is also provided with a laser package holder 20, which comprises (a) a holder main body 21 for supporting and accommodating the laser package 10, and (b) a connecting member 22 for connection to the converging optical system unit 3, the connecting member 22 having been secured to the holder main body 21 of the laser package holder 20.

The holder main body 21 is a cylindrical member (preferably, a specular cylinder), which has an inside surface brought into contact with a circumferential surface of the package base 13 and which covers the entire laser package 10 from the side of the circumferential surface of the laser package 10. In this embodiment, the laser package 10 and the holder main body 21 are combined with each other by use of a press fit technique. With the constitution described above, the laser package 10 and the holder main body 21 are capable of being accurately brought into contact with each other, and the heat dissipation from the laser package 10 to the holder main body 21 is capable of being performed efficiently.

The holder main body 21 is the cylindrical member having a shape such that a part of a circular cylinder, which part is located on an outside surface side of an end section that stands facing the converging optical system unit 3, has been cut away from the circular cylinder. The section having the partially cut-away shape is herein referred to as a cut-away section 21a. The connecting member 22 is constituted of a metal ring, or the like. The connecting member 22 is secured to the cut-away section 21a of the holder main body 21 by use of a press fit technique, or the like. The thickness of the connecting member 22 is designed such that an end face of the connecting member 22, which stands facing the converging optical system unit 3, may protrude from the holder main body 21 toward the side of the converging optical system unit 3.

The converging lens 31 has a laser beam incidence surface, which is constituted as a convex lens surface, and a laser beam radiating surface, which is constituted as a convex lens surface. The converging lens 31 is located so as to stand facing the laser beam transmissive window 14a of the can package 15.

Besides the converging lens 31, the converging optical system unit 3 is also provided with a converging lens holder (a converging optical system holder) 40, which comprises (a) a holder main body 41 for supporting and accommodating the converging lens 31, and (b) a connecting member 42 for connection to the laser unit 2, the connecting member 42 having been secured to the holder main body 41 of the converging lens holder 40.

The holder main body 41 of the converging lens holder 40 is constituted of a cylindrical member, whose inside diameter is altered in stages from the laser beam incidence side to the laser beam radiating side. A receptacle 43 for receiving an end section of the optical fiber 51, which end section is located on the laser beam incidence side, is secured to a laser beam radiating side end face 41X of the holder main body 41. In this embodiment, an adjustment is made such that a convergence point of the laser beam L may be located on the laser beam radiating side end face 41X.

An inside diameter Da of an end section 41a of the holder main body 41, which end section is located on the laser beam incidence side, is set to be approximately equal to the diameter of the converging lens 31. The converging lens 31 is fitted into the end section 41a of the holder main body 41 and is supported by the end section 41a. A section 41b of the holder main body 41, which section continues from the end section 41a, has an inside diameter Db, which is smaller than the inside diameter Da of the end section 41a. Also, a section 41c of the holder main body 41, which section continues from the section 41b, has an inside diameter Dc, which is smaller than the inside diameter Db of the section 41b. An end section 41d of the holder main body 41, which end section is located on the laser beam radiating side, has an inside diameter Dd, which is larger than the inside diameter Dc of the section 41c.

The section 41c of the holder main body 41 takes the position, which is closer to the side of the laser unit 2 than the convergence point of the laser beam L is, and at which the laser beam L has been converged to a certain extent. The inside diameter Dc of the section 41c is set to be approximately equal to the maximum diameter of the laser beam L, which passes through the inside area of the section 41c. A laser beam transmissive protecting member 46 is releasably fitted into the inside cavity of the end section 41d of the holder main body 41, which end section is located on the laser beam radiating side. At the time at which the optical fiber 51 has been fitted into the receptacle 43, the laser beam transmissive protecting member 46 comes into contact with the laser beam incidence surface of the optical fiber 51 and protects the laser beam incidence surface of the optical fiber 51. The laser beam transmissive protecting member 46 should preferably be constituted of a circular cylinder-shaped glass block, or the like. The section 41c of the holder main body 41 acts as a stopper for the laser beam transmissive protecting member 46.

The connecting member 42 of the converging lens holder 40 is a cylindrical member constituted of a laser beam incidence side end section 42a and a small diameter section 42b. The laser beam incidence side end section 42a has an outside diameter, which is larger than the outside diameter of the small diameter section 42b. The connecting member 42 has an inside diameter, which is approximately equal to the outside diameter of the holder main body 41. The end section 41a of the holder main body 41, which end section is located on the laser beam incidence side, is fitted into the region inward from the small diameter section 42b of the connecting member 42, such that the holder main body 41 is capable of sliding in the direction of the optical axis. The holder main body 41 is slid with respect to the connecting member 42, and the position of the converging lens 31 is thereby adjusted such that the convergence point of the laser beam L may be located on the laser beam radiating side end face 41X of the holder main body 41. Thereafter, the holder main body 41 and the connecting member 42 of the converging lens holder 40 are secured by welding processing to each other. (The welded site is represented by Y1 in FIG. 1.) Also, the laser beam incidence side end section 42a of the connecting member 42, which end section has the large diameter, is brought into contact with the connecting member 22 of the laser package holder 20, and the laser beam incidence side end section 42a and the connecting member 22 are secured by welding processing to each other. (The welded site is represented by Y2 in FIG. 1.) No limitation is imposed upon the technique for the welding of the holder main body 41 and the connecting member 42 to each other and the welding of the laser beam incidence side end section 42a and the connecting member 22 to each other. From the view point of the aligning and securing efficiency, the welding processing should preferably be performed with a YAG welding technique, or the like.

With the conventional laser modules, all of the holder main body and the connecting member of the laser package holder and the holder main body and the connecting member of the converging lens holder have been constituted of the stainless steel (SUS) having a comparatively low thermal conductivity.

With this embodiment of the laser module 1 in accordance with the present invention, the holder main body 21 of the laser package holder 20 is constituted of a material different from the material of the connecting member 22 of the laser package holder 20 and the material of the connecting member 42 of the converging lens holder 40. Also, the thermal conductivity of the holder main body 21 of the laser package holder 20 is set at a value larger than the thermal conductivity of the connecting member 22 of the laser package holder 20 and the thermal conductivity of the connecting member 42 of the converging lens holder 40. The thermal conductivity of the holder main body 21 of the laser package holder 20 should preferably be set to be at least 150 W/mK, and the thermal conductivity of the connecting member 22 of the laser package holder 20 and the thermal conductivity of the connecting member 42 of the converging lens holder 40 should preferably be set to be at most 30 W/mK. It is preferable for the holder main body 41 of the converging lens holder 40 and the connecting member 42 of the converging lens holder 40 to be constituted by the same material.

The holder main body 21 of the laser package holder 20 should preferably be constituted of a material selected from the group consisting of aluminum (thermal conductivity: 238 W/mK), an aluminum alloy, copper (thermal conductivity: 395 W/mK), and a copper alloy.

The material of the connecting member 22 of the laser package holder 20, the material of the holder main body 41 of the converging lens holder 40, and the material of the connecting member 42 of the converging lens holder 40 should preferably be a stainless steel (e.g., SUS304 having a thermal conductivity of 16 W/mK), or the like, which is a low thermal conductive material having a thermal conductivity of at most 30 W/mK, which is easy to weld, and which is a general-purpose material.

In this embodiment, the thermal conductivity of the holder main body 21 of the laser package holder 20, which holder main body is in contact with the package base 13, is set at a comparatively large value. Therefore, a particular heat dissipating member need not be utilized, and the heat released from the laser element 11 is capable of being efficiently dissipated via the package base 13 and the holder main body 21 of the laser package holder 20 to the exterior.

Also, if the thermal conductivity of the laser package holder 20 is merely set at a comparatively large value, there will be the risk that, at the time of the welding of the laser package holder 20 and the converging lens holder 40 to each other, the welding heat will be easily conducted to the entire laser package holder 20, and the laser element 11 having been accommodated within the laser package holder 20, and the like, will be adversely affected by the conducted welding heat.

In this embodiment of the laser module 1 in accordance with the present invention, as for the connecting member 22 of the laser package holder 20 and the connecting member 42 of the converging lens holder 40, which connecting members are to be welded to each other, the thermal conductivities are set to be comparatively small. With the constitution described above, the conduction of the welding heat to the region within the laser package holder 20 is capable of being suppressed.

Further, with this embodiment, the end face of the connecting member 22, which end face stands facing the side of the converging optical system unit 3, is protruded from the holder main body 21 toward the converging optical system unit 3, and the bonding surface, at which the connecting member 22 and the connecting member 42 are bonded to each other, and the holder main body 21 are isolated from each other via a space. With the constitution described above, the conduction of the welding heat to the region within the laser package holder 20 is capable of being suppressed even further. Therefore, a heat energy quantity necessary for the welding processing is capable of being kept small. Also, a rise of the temperatures of the members located in the vicinity of the welded site is capable of being suppressed, a strain due to the welding processing is capable of being suppressed, and the high-accuracy welding processing is capable of being performed.

In this embodiment, with the constitution described above, thermal deterioration of the laser element 11, and the like, is capable of being suppressed markedly, and the life time of the laser module 1 is capable of being kept long.

In this embodiment, the optical fiber 51 takes on the form of an optical fiber with connector attached 50, which is provided with a connector 53 to be fitted into the receptacle 43. The optical fiber with connector attached 50 is capable of being releasably fitted into the receptacle 43. The optical fiber with connector attached 50 comprises a ferrule 52, in which the laser beam incidence side end section of the optical fiber 51 has been inserted and secured. The ferrule 52 and its neighboring part are fitted in the connector 53 such that the ferrule 52 and its neighboring part are capable of moving in the direction of the optical axis. The connector 53 incorporates therein a spring member 54. At the time at which the connector 53 has been fitted into the receptacle 43, the spring member 54 pushes the ferrule 52 against the laser beam transmissive protecting member 46.

The receptacle 43 has a double structure comprising an inside member 44 and an outside member 45, which are located in the form of concentric circles and are fitted to each other. The inside member 44 is provided with a cylindrical inside sleeve 44a and a cylindrical outside sleeve 44b. The inside sleeve 44a of the inside member 44 enters into the region between the outside surface of the ferrule 52 and the inside surface of the connector 53, approximately comes into contact with the outside surface of the ferrule 52, and thereby supports the outside surface of the ferrule 52. The outside sleeve 44b of the inside member 44 engages with the outside surface of the connector 53 and supports the outside surface of the connector 53. The outside sleeve 44b of the inside member 44 is provided with an engagement section 44c, and the connector 53 is provided with an engagement section 53a for engagement with the engagement section 44c of the outside sleeve 44b. The outside member 45 is a cylindrical member for covering and protecting the region, in which the inside member 44 and the connector 53 are fitted to each other, and the like.

When the connector 53 has been fitted into the receptacle 43, the ferrule 52 is pushed by the urging force of the spring member 54 against the laser beam transmissive protecting member 46, and the laser beam incidence surface of the optical fiber 51 is brought into contact with the laser beam transmissive protecting member 46.

A variation of the inside diameter of the inside sleeve 44a of the receptacle 43 should preferably be at most 2 μm. Also, the variation of the outside diameter of the ferrule 52 should preferably be at most 1 μm. In cases where the dimensional accuracy is of the level described above, the position of the convergence point of the laser beam L and the positions of the ferrule 52 and the optical fiber 51 having been supported by the ferrule 52 are capable of being matched with each other at a position accuracy of 3 μm or a higher position accuracy. Therefore, the laser beam L is capable of being caused to impinge upon a core of the optical fiber 51 with a low loss.

In cases where a laser element having a high output power is employed as the laser element 11, if the laser beam incidence surface of the optical fiber 51 is exposed to the surrounding region, the problems described below will occur. Specifically, at the convergence point and its neighboring region, the power density of the laser beam L is high. Therefore, for example, dust floating in the surrounding region will cling to the laser beam incidence surface of the optical fiber 51. Also, decomposition products formed by chemical reactions of organic substances, which have been vaporized in the surrounding region, and the laser beam L with each other will cling to the laser beam incidence surface of the optical fiber 51. As a result, after the use for a long period of time, the laser beam incidence surface of the optical fiber 51 will be contaminated, and the optical characteristics, such as the transmittance, will become bad. However, with this embodiment of the laser module 1 in accordance with the present invention, in which the laser beam transmissive protecting member 46 is fitted into the holder main body 41 of the converging lens holder 40, the laser beam incidence surface of the optical fiber 51 is capable of being protected from the contamination, and the stability in the long term use is capable of being kept high.

In this embodiment, the laser module 1 should preferably be designed such that the power density of the laser beam L impinging upon a laser beam incidence surface 46X of the laser beam transmissive protecting member 46 is set to be at most 10 W/mm$^2$. The power density of the laser beam L at the laser beam incidence surface 46X of the laser beam transmissive protecting member 46 is lower than the power density at the convergence point. However, at the laser beam incidence surface 46X of the laser beam transmissive protecting member 46, the laser beam L has been converged to a certain extent, and the power density of the laser beam L is comparatively high. The inventors have found that, in cases where the power density of the laser beam L at the exposed laser beam incidence surface 46X of the laser beam transmissive protecting member 46 is set to be low as described above, the contamination of the laser beam incidence surface 46X of the laser beam transmissive protecting member 46 is capable of being suppressed sufficiently.

Figure 3:
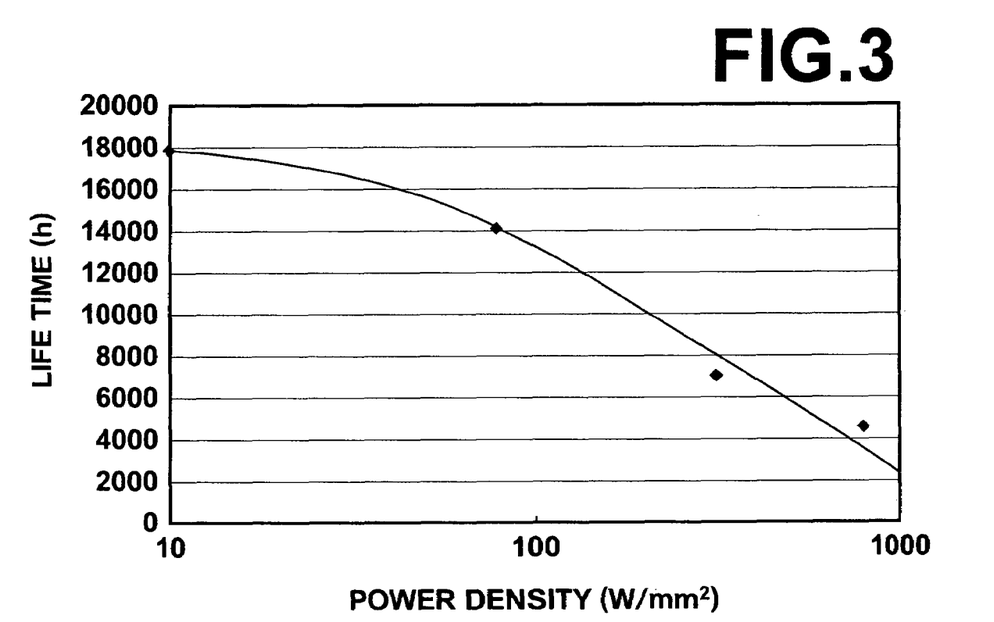
FIG. 3 is a graph showing an example of a relationship between a power density of a laser beam impinging upon a laser beam incidence surface of a laser beam transmissive protecting member and a life time of the laser module.

FIG. 3 is a graph showing an example of a relationship between the power density of the laser beam L impinging upon the laser beam incidence surface 46X of the laser beam transmissive protecting member 46 and the life time of the laser module 1. The relationship illustrated in FIG. 3 is the one obtained in cases where the laser beam transmissive protecting member 46 is not exchanged with a new one and in cases where the output power of the laser element 11 is set at 250 mW. The life time of the laser module 1 illustrated in FIG. 3 represents the period of time occurring before the output power of the laser module 1 reduces to 60% of the initial output power. As illustrated in FIG. 3, as the power density of the laser beam L impinging upon the laser beam incidence surface 46X of the laser beam transmissive protecting member 46 becomes high, the degree of the deterioration of the laser module 1 becomes high. Also, it is shown that, in cases where the power density of the laser beam L impinging upon the laser beam incidence surface 46X of the laser beam transmissive protecting member 46 is set to be at most 10 W/mm$^2$, a life time of at least approximately 18,000 hours is capable of being obtained. A laser module as described in, for example, Japanese Unexamined Patent Publication No. 2004-253783, in which a laser beam incidence surface of an optical fiber is perfectly sealed hermetically such that the laser beam incidence surface of the optical fiber may not be exposed to the ambient atmosphere, has a product life time of approximately 20,000 hours. With this embodiment of the laser module 1 in accordance with the present invention, the extent of the lowering of the life time with respect to the life time of the laser module having been perfectly sealed is as small as at most 10%. With this embodiment of the laser module 1 in accordance with the present invention, instead of the perfect sealing being performed, the laser module 1 having the long life time is capable of being furnished. Therefore, with this embodiment of the laser module 1 in accordance with the present invention, the cost of the laser module is capable of being kept low.

The power density of the laser beam L impinging upon the laser beam incidence surface 46X of the laser beam transmissive protecting member 46 is capable of being adjusted by the designing of, for example, the thickness of the laser beam transmissive protecting member 46, which thickness is taken in the direction of the optical axis.

By way of example, the conditions may be set such that the output power of the laser element 11 is equal to 250 mW, an NA of the optical fiber 51 is equal to 0.22, the incidence NA of the converged laser beam is equal to 0.2, and a glass having a refractive index of 1.5 is employed as the laser beam transmissive protecting member 46, the NA of the converged laser beam within the laser beam transmissive protecting member 46 becomes equal to 0.1217. Under the conditions described above, in cases where the thickness of the laser beam transmissive protecting member 46 is equal to 0.7 mm, the power density of the laser beam L impinging upon the laser beam incidence surface 46X of the laser beam transmissive protecting member 46 becomes equal to 10 $W/mm^2$. Under the conditions identical with the conditions described above, except that the output power of the laser element 11 is set at 1 W, in cases where the thickness of the laser beam transmissive protecting member 46 is equal to 1 mm, the power density of the laser beam L impinging upon the laser beam incidence surface 46X of the laser beam transmissive protecting member 46 becomes equal to 10 $W/mm^2$. Therefore, under the conditions described above, in which the output power of the laser element 11 is equal to 250 mW, the thickness of the laser beam transmissive protecting member 46 may be set to be at least 0.7 mm. Also, under the conditions described above, in which the output power of the laser element 11 is equal to 1 W, the thickness of the laser beam transmissive protecting member 46 may be set to be at least 1.0 mm. In such cases, the power density of the laser beam L impinging upon the laser beam incidence surface 46X of the laser beam transmissive protecting member 46 is capable of being set at 10 $W/mm^2$.

In this embodiment, as illustrated in FIG. 1 and FIG. 2, the connector 53 is capable of being releasably fitted into the receptacle 43. Also, the laser beam transmissive protecting member 46 is capable of being releasably fitted into the converging lens holder 40. The laser beam transmissive protecting member 46 is capable of being fitted into the converging lens holder 40 and removed from the converging lens holder 40 by being passed through the region within the inside sleeve 44a of the receptacle 43. In this embodiment, in cases where the laser beam incidence surface 46X of the laser beam transmissive protecting member 46, or the like, is contaminated after the long term use, cleaning of the laser beam transmissive protecting member 46 and the exchange of the laser beam transmissive protecting member 46 are capable of being performed easily. With this embodiment, the position of the convergence point of the laser beam L and the positions of the inside sleeve 44a and the outside sleeve 44b in the receptacle 43 are fixed. Therefore, in cases where the laser beam transmissive protecting member 46 or the optical fiber 51 is exchanged with a new one, the accuracy of the position of the convergence point of the laser beam L and the position of the optical fiber 51 is capable of being kept high.

(Process for Producing the Laser Module 1)

A process for producing this embodiment of the laser module 1 in accordance with the present invention will be described hereinbelow.

Specifically, firstly, the laser element 11 is mounted on the heat dissipating block 12 of the can package 15. When necessary, deaeration processing, introduction of an inert gas, and the like, are performed. Thereafter, the package base 13 and the cap 14 are welded to each other by use of the resistance welding technique, and the region surrounded by the package base 13 and the cap 14 is thus sealed hermetically. In this manner, the laser package 10 is prepared. The thus prepared laser package 10 is then press-fitted into the region within the holder main body 21 of the laser package holder 20 from the opening on one side of the holder main body 21 and is thus secured in the holder main body 21. Before the laser package 10 is press-fitted and secured in the holder main body 21 or after the laser package 10 has been press-fitted and secured in the holder main body 21, the connecting member 22 is press-fitted onto the holder main body 21 and secured to the holder main body 21. With the procedure described above, the laser unit 2 is prepared.

Also, the holder main body 41, into which the laser beam transmissive protecting member 46 has been fitted previously, is fitted into the connecting member 42 of the converging lens holder 40. The position of the holder main body 41 is then adjusted such that the convergence point of the laser beam L may be located on the laser beam radiating side end face 41X of the holder main body 41. After the position adjustment has been made, the holder main body 41 and the connecting member 42 of the converging lens holder 40 are welded to each other. With the procedure described above, the converging optical system unit 3 is prepared.

In this embodiment, the laser beam transmissive protecting member 46, which comes into contact with the laser beam incidence surface of the optical fiber 31 and thereby protects the laser beam incidence surface of the optical fiber 51, is utilized, such that the laser beam incidence surface of the optical fiber 51 may not be exposed to the surrounding region. Therefore, high hermetic sealing characteristics are not required of the converging lens holder 40. Accordingly, particularly high hermetic sealing characteristics are not required of the welding processing for the welding of the holder main body 41 and the connecting member 42 of the converging lens holder 40 to each other. Alternatively, in lieu of the welding processing being performed, the holder main body 41 and the connecting member 42 of the converging lens holder 40 may be secured to each other by use of an adhesive agent, a solder, or the like.

Thereafter, the laser unit 2 and the converging optical system unit 3 are aligned with each other. The connecting member 22 of the laser package holder 20 and the connecting member 42 of the converging lens holder 40 are then welded to each other.

Thereafter, the receptacle 43 is secured to the laser beam radiating side end face 41X of the holder main body 41 of the converging lens holder 40. The receptacle 43 is secured at the position, at which the laser beam L is capable of being converged and caused to impinge upon the optical fiber 51 most efficiently. Finally, the optical fiber with connector attached 50 is fitted into the receptacle 43. With the procedure described above, this embodiment of the laser module 1 is completed.

In this embodiment of the laser module 1 in accordance with the present invention, the thermal conductivity of the holder main body 21 of the laser package holder 20 is set at a value larger than the thermal conductivity of the connecting member 22 of the laser package holder 20 and the thermal conductivity of the connecting member 42 of the converging lens holder 40. The thermal conductivity of the holder main body 21 of the laser package holder 20 should preferably be set to be at least 150 W/mK, and the thermal conductivity of the connecting member 22 of the laser package holder 20 and the thermal conductivity of the connecting member 42 of the converging lens holder 40 should preferably be set to be at most 30 W/mK.

In this embodiment, as described above in detail, the thermal conductivity of the holder main body 21 of the laser package holder 20 is set at a comparatively large value. Therefore, a particular heat dissipating member need not be utilized, and the heat dissipating characteristics with respect to the heat released from the laser element 11 are capable of being enhanced. In this embodiment of the laser module 1 in accordance with the present invention, as for the connecting member 22 of the laser package holder 20 and the connecting member 42 of the converging lens holder 40, which connecting members are to be welded to each other, the thermal conductivities are set to be comparatively small. Therefore, the conduction of the welding heat to the region within the laser package holder 20 is capable of being suppressed. With this embodiment, by virtue of both the effect of the enhanced heat dissipating characteristics with respect to the heat released from the laser element 11 and the effect of the suppression of the conduction of the welding heat to the region within the laser package holder 20, thermal deterioration of the laser element 11, and the like, is capable of being suppressed markedly, and the life time of the laser module 1 is capable of being kept long.

Also, in this embodiment of the laser module 1, the converging lens holder 40 is provided with the receptacle 43 for receiving the laser beam incidence side end section of the optical fiber 51. The converging lens holder 40 is also provided with the laser beam transmissive protecting member 46. At the time at which the optical fiber 51 has been fitted into the receptacle 43, the laser beam transmissive protecting member 46 comes into contact with the laser beam incidence surface of the optical fiber 51 and thereby protects the laser beam incidence surface of the optical fiber 51. Therefore, contamination of the laser beam incidence surface of the optical fiber 51 is capable of being suppressed, and the life time of the laser module 1 is capable of being kept long.

Further, the power density of the laser beam L impinging upon the laser beam incidence surface 46X of the laser beam transmissive protecting member 46 is set to be at most 10 W/mm$^2$. Therefore, contamination of the laser beam incidence surface 46X of the laser beam transmissive protecting member 46 is capable of being suppressed.

The aforesaid embodiment of the laser module 1 is provided with the one laser element 11. Alternatively, the laser module in accordance with the present invention may be constituted as a beam combining type of module, in which a plurality of laser elements 11, 11, . . . are provided, and in which the laser beams having been radiated out from the plurality of the laser elements 11, 11, . . . are combined with one another and are caused to impinge upon the one optical fiber 51. In cases where the plurality of the laser elements 11, 11, . . . are thus utilized, the laser module should preferably be constituted such that each of the laser elements 11, 11, . . . is mounted on one of different heat dissipating blocks 12, 12, . . . , and such that the plurality of the heat dissipating blocks 12, 12, . . . are arrayed within the can package 15.

With the laser module in accordance with the present invention, it is possible to furnish a small-sized laser module having a simple module structure and a long life time and capable of coping with a system in which a heat release quantity within the laser package 10 is large (e.g., a system in which a high output power laser element, such as a GaN type of laser element, is utilized, or a system in which a plurality of laser elements are utilized). The aforesaid embodiment of the laser module 1 is efficient particularly in cases where, for example, an ultraviolet semiconductor laser, which has a high output power and produces a laser beam having wavelengths falling within the range of 350 nm to 500 nm, is utilized as the laser element 11.

(Design Modifications)

The laser module in accordance with the present invention is not limited to the embodiment described above and may be embodied in various other ways.

For example, in the embodiment described above, the converging lens holder 40 is constituted of the holder main body 41 and the connecting member 42. Alternatively, a converging lens holder, which is constituted of one member containing the holder main body 41 and the connecting member 42 having been combined into an integral body, may be utilized. In such cases, the connecting member 22 of the laser package holder 20 and the converging lens holder may be welded and secured to each other. With the constitution described above, the thermal conductivity of the holder main body 21 of the laser package holder 20 may be set at a value, which is larger than the thermal conductivity of the connecting member 22 of the laser package holder 20 and the thermal conductivity of the converging lens holder. In such cases, the thermal conductivity of the holder main body 21 of the laser package holder 20 should preferably be set to be at least 150 W/mK, and the thermal conductivity of the connecting member 22 of the laser package holder 20 and the thermal conductivity of the converging lens holder should preferably be set to be at most 30 W/mK. With the modification described above, the same effects as those obtained with the embodiment described above are capable of being obtained.

Also, in the embodiment described above, the converging optical system is constituted of the one converging lens 31. Alternatively, the converging optical system may be constituted of a combination of lenses, such as a combination of a collimator lens for collimating the laser beam L and a converging lens. In cases where the converging optical system is constituted of the combination of the collimator lens and the converging lens, the alignment may be performed with an adjustment of the position of the collimator lens.

Further, the manner of the connection of the converging lens holder 40 and the optical fiber 51 to each other, and the like, may be altered in various other ways.

EXAMPLES

The present invention will further be illustrated by the following non-limitative examples.

Example 1

Figure 4:
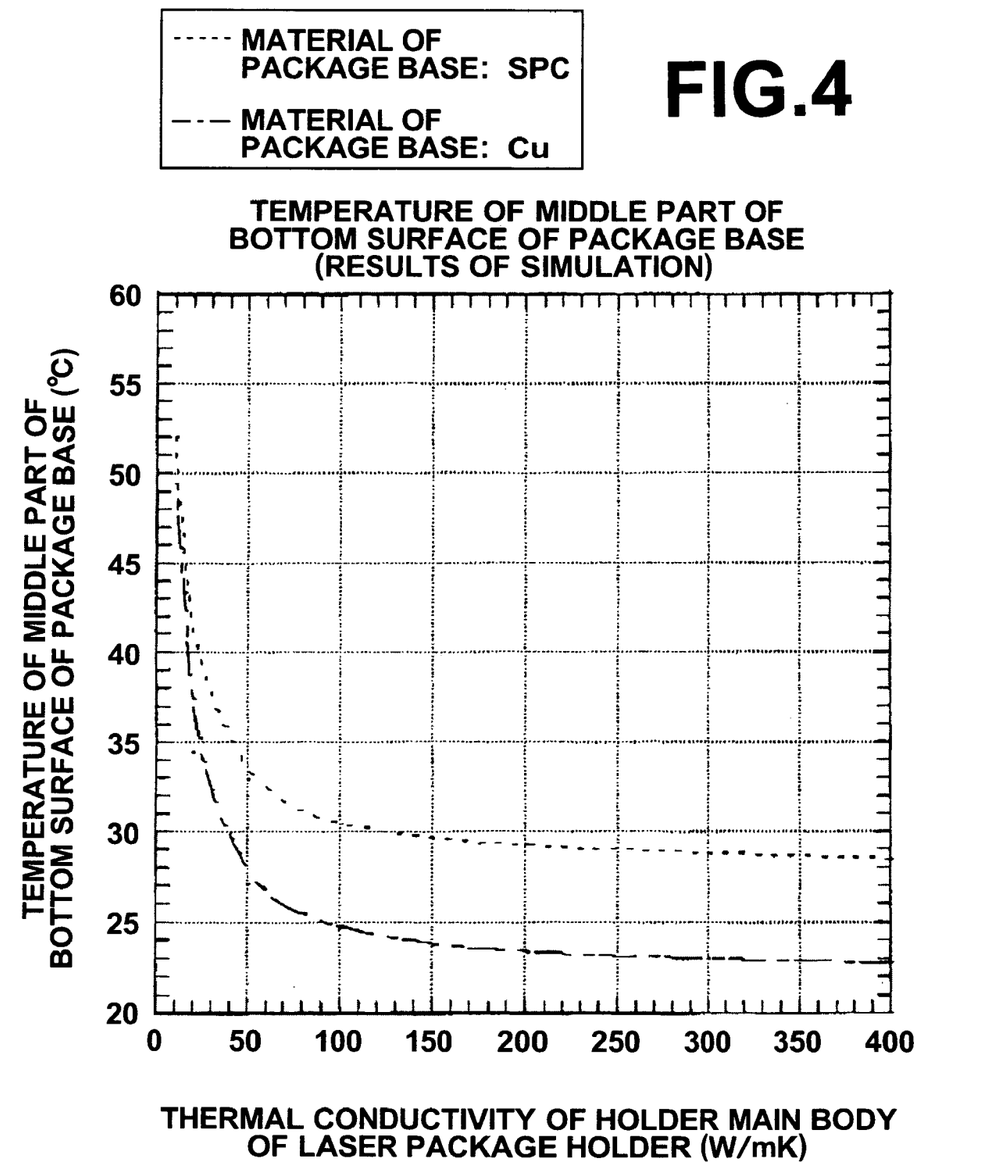
FIG. 4 is a graph showing results of a simulation with respect to heat dissipating characteristics.

With respect to the aforesaid embodiment of the laser module 1, the heat dissipating characteristics were evaluated by making a simulation by use of a three-dimensional hot fluid system (supplied by Software Cradle Co.). FIG. 4 is a graph showing results of a simulation with respect to heat dissipating characteristics. Since the element temperature of the laser element 11 and the temperature of the bottom surface of the package base 13 exhibited approximately identical temperature changes with a certain predetermined temperature difference being kept, in lieu of the element temperature of the laser element 11 being calculated, the temperature of a middle part of the bottom surface of the package base 13 was calculated with the simulation. The simulation conditions were set as described below.

Laser element 11: One high output power laser element having an output power of 500 mW and an electric power-to-laser beam conversion efficiency of 23%.

Can package 15: A 5.6 mm-diameter can package provided with the package base 13 constituted of a structure body, in which a Cu plate was employed as the base material and in which an Fe—Ni—Co alloy was bonded at the site of the welding to the cap 14.

Thermal conductivity of the holder main body 21 of the laser package holder 20: At least 150 W/mK.

The simulation was made under the conditions such that the temperature of the heat dissipating block 12 might be kept at 20° C. As a result, it was confirmed that the temperature of the middle part of the bottom surface of the package base 13 was as low as at most 24° C. It was thus confirmed that the temperature rise was kept to be small, and that the laser module 1 exhibited good heat dissipating characteristics.

Example 2

The laser module 1 was produced with the process described above with respect to the aforesaid embodiment. In the process for producing the laser module 1, one piece of a GaN type semiconductor laser element having an output power of 200 mW was employed as the laser element 11. Also, the heat dissipating block 12 of the laser package 10 was made from Cu (thermal conductivity: 395 W/mK), and the package base 13 was made from a cold-rolled steel SPC (thermal conductivity: 71 W/mK). Further, the holder main body 21 of the laser package holder 20 was made from an aluminum alloy (thermal conductivity: 200 W/mK). Furthermore, the connecting member 22 of the laser package holder 20 and the holder main body 41 and the connecting member 42 of the converging lens holder 40 were made from a stainless steel (SUS304, thermal conductivity: 16 W/mK).

<Evaluation and Results>

With respect to the laser module 1 having been produced in Example 2, the temperature of the bottom surface of the package base 13 was measured by use of a thermistor. In cases where the temperature of the heat dissipating block 12 was kept at 20° C., the temperature of the middle part of the bottom surface of the package base 13 was measured to be 25° C. The temperature rise with respect to the holder main body 21 was as small as 5° C. It was thus confirmed that the laser module 1 having been produced in Example 2 exhibited good heat dissipating characteristics. The results of the measurement approximately coincided with the results of the simulation made in Example 1.

From the evaluation results obtained in Example 1 and Example 2, it was confirmed that, with the laser module in accordance with the present invention, good heat dissipating characteristics were capable of being obtained in cases where the laser element having a high output power ranging from 200 mW to 500 mW, having a low electric power-to-laser beam conversion efficiency, and having a large heat release quantity was utilized.

INDUSTRIAL APPLICABILITY

The laser module in accordance with the present invention is capable of being utilized appropriately in use applications of optical communication, laser beam processing machines, solid-state laser pumping light sources, and the like.

What is claimed is:

1. A laser module, comprising:
   i) a laser unit containing a laser package, which is provided with a laser beam transmissive window for radiation of a laser beam and in which at least one laser element has been hermetically sealed,
   ii) a converging optical system unit, which contains a converging optical system for converging the laser beam having been radiated out from the laser package, and
   iii) an optical fiber for receiving the laser beam having been converged by the converging optical system,
   the laser unit and the converging optical system unit having been connected to each other,
   wherein the laser unit is provided with a laser package holder, which comprises (a) a holder main body for supporting and accommodating the laser package, and (b) a connecting member for connection to the converging optical system unit, the connecting member having been secured to the holder main body of the laser package holder,
   the converging optical system unit is provided with a converging optical system holder, which comprises (a) a holder main body for supporting and accommodating the converging optical system, and (b) a connecting member for connection to the laser unit, the connecting member having been secured to the holder main body of the converging optical system holder,
   the connecting member of the laser package holder and the connecting member of the converging optical system holder have been welded to each other, and
   a thermal conductivity of the holder main body of the laser package holder is set at a value, which is larger than the thermal conductivity of the connecting member of the laser package holder and the thermal conductivity of the connecting member of the converging optical system holder.

2. A laser module as defined in claim 1 wherein the thermal conductivity of the holder main body of the laser package holder is equal to at least 150 W/mK, and the thermal conductivity of the connecting member of the laser package holder and the thermal conductivity of the connecting member of the converging optical system holder are equal to at most 30 W/mK.

3. A laser module, comprising:
   i) a laser unit containing a laser package, which is provided with a laser beam transmissive window for radiation of a laser beam and in which at least one laser element has been hermetically sealed,
   ii) a converging optical system unit, which contains a converging optical system for converging the laser beam having been radiated out from the laser package, and
   iii) an optical fiber for receiving the laser beam having been converged by the converging optical system,
   the laser unit and the converging optical system unit having been connected to each other,
   wherein the laser unit is provided with a laser package holder, which comprises (a) a holder main body for supporting and accommodating the laser package, and (b) a connecting member for connection to the converging optical system unit, the connecting member having been secured to the holder main body of the laser package holder, the converging optical system unit is provided with a converging optical system holder for supporting and accommodating the converging optical system, the connecting member of the laser package holder and the converging optical system holder have been welded to each other, and a thermal conductivity of the holder main body of the laser package holder is set at a value, which is larger than the thermal conductivity of the connecting member of the laser package holder and the thermal conductivity of the converging optical system holder.

4. A laser module as defined in claim 3 wherein the thermal conductivity of the holder main body of the laser package holder is equal to at least 150 W/mK, and the thermal conductivity of the connecting member of the laser package holder and the thermal conductivity of the converging optical system holder are equal to at most 30 W/mK.

5. A laser module as defined in claim 1 wherein the converging optical system holder is provided with a receptacle for receiving an end section of the optical fiber, which end section is located on a laser beam incidence side, and a laser beam transmissive protecting member, which comes into contact with a laser beam incidence surface of the optical fiber having been fitted into the receptacle and thereby protects the laser beam incidence surface of the optical fiber.

6. A laser module as defined in claim 3 wherein the converging optical system holder is provided with a receptacle for receiving an end section of the optical fiber, which end section is located on a laser beam incidence side, and a laser beam transmissive protecting member, which comes into contact with a laser beam incidence surface of the optical fiber having been fitted into the receptacle and thereby protects the laser beam incidence surface of the optical fiber.

7. A laser module as defined in claim 5 wherein a power density of the laser beam impinging upon a laser beam incidence surface of the laser beam transmissive protecting member is set to be at most 10 W/mm$^2$.

8. A laser module as defined in claim 6 wherein a power density of the laser beam impinging upon a laser beam incidence surface of the laser beam transmissive protecting member is set to be at most 10 W/mm$^2$.

9. A laser module as defined in claim 1 wherein the laser element is of the type producing the laser beam having a wavelength falling within the range of 350 nm to 500 nm.

10. A laser module as defined in claim 3 wherein the laser element is of the type producing the laser beam having a wavelength falling within the range of 350 nm to 500 nm.

* * * * *